United States Patent
Horng et al.

(10) Patent No.: US 6,703,654 B1
(45) Date of Patent: Mar. 9, 2004

(54) BOTTOM ELECTRODE FOR MAKING A MAGNETIC TUNNELING JUNCTION (MTJ)

(75) Inventors: Cheng T. Horng, San Jose, CA (US); Ru-Ying Tong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 35 days.

(21) Appl. No.: 10/371,841

(22) Filed: Feb. 20, 2003

(51) Int. Cl.[7] ............................................. H01L 21/8242

(52) U.S. Cl. .......................... 257/295; 257/326; 438/3

(58) Field of Search ................................. 257/295–297, 257/314–326; 438/3, 238–240, 381, 393–395

(56) References Cited

U.S. PATENT DOCUMENTS 6,542,342 B1 * 4/2003 Hayashi et al. .......... 360/324.2

* cited by examiner

Primary Examiner—H. Jey Tsai
(74) Attorney, Agent, or Firm—George O. Saile; Stephen B. Ackerman

(57) ABSTRACT

An MTJ (magnetic tunneling junction) device particularly suitable for use in an MRAM (magnetic random access memory) is formed on a bottom conductor electrode which is smooth and has a low sheet resistivity. The advantageous properties of the conductor electrode are due in part to crystal plane alignment of a high melting-point metal layer by a seed layer and an overlayer and by the specular reflection of conduction electrons within the metal layer. The resulting device has improved performance characteristics and the electrode allows the device to be easily fabricated singly or in an array and integrated with associated CMOS circuitry on a large diameter wafer.

25 Claims, 1 Drawing Sheet

BOTTOM ELECTRODE FOR MAKING A MAGNETIC TUNNELING JUNCTION (MTJ)

RELATED PATENT APPLICATION

This application is related to Ser. No. 09/689,932, filing date Oct. 13, 2000 assigned to the same assignee as the current invention.

BACKGROUND OF THE INVENTION

1. Field of the Invention

This invention relates generally to magnetic tunneling junction (MTJ) devices and more particularly to a method of fabricating a bottom electrode for such a device, wherein the method produces an electrode which is smooth, thermally stable and has a low sheet resistance.

2. Description of the Related Art

The magnetic tunneling junction device (MTJ) is essentially a magnetic switch which permits or prevents the flow of spin-polarized tunneling electrons (i.e. the device has a low or a high resistance) through a very thin dielectric spacer layer formed between an upper and lower electrode. Because the tunneling is spin-polarized, the current depends upon the relative orientation of the magnetizations of magnetic layers above and below the spacer layer. Most advantageously, one of the two magnetic layers (the pinned layer) in the MTJ has its magnetization fixed in direction, while the other layer (the free layer) has its magnetization free to move in response to an external switching stimulus. Gallagher et al. (U.S. Pat. No. 5,841,692), teaches a prototypical form of such a device having a usefully large magnetoresistive response and capable of operating at room temperatures.

Magnetic tunneling junction devices are now being utilized as information storage elements in magnetic random access memories (MRAMs). Typically, when used as an information storage or memory device, a sensing current passed through the MTJ indicates if it is in a high or low resistance state, which is an indication of whether its magnetizations are, respectively, antiparallel or parallel. An MTJ device used in this way requires a very smooth bottom electrode if it is to operate most advantageously, particularly when integrated with CMOS devices to which it is connected electrically by means of the bottom electrode. Cardoso et al. ("Electrode roughness and interfacial mixing effects on the tunnel junction thermal stability," J. of Appl. Phys., Vol. 89, No. 11, Jun. 1, 2001, pp. 6650–6652) verify the adverse effects of roughness of both barrier layers and electrodes in MTJ devices. Tehrani et al. ("Recent Developments in Magnetic Tunnel Junction MRAM," IEEE Trans. on Magnetics, Vo. 36, No. 5, September 2000, pp. 2752–2757) discuss the vertical integration of MTJ devices and CMOS devices which will proceed most advantageously with smooth electrodes. The extreme thinness of the active layers in an MTJ device (e.g. free, pinned and spacer layers) tend to exacerbate the effects of any surface roughness of the layers on which they are formed (e.g. the electrode layers). Slaughter et al. (U.S. Pat. No. 6,205,052 B1) point out that film surfaces that give rise to interfacial roughness cause unwanted magnetic coupling between magnetic layers, which is called topological coupling. To reduce such unwanted coupling, Slaughter teaches an MTJ device in which a base metal layer is formed on a substrate, a spacer layer is formed between magnetically fixed and free layers, and at least one layer of amorphous structure is formed between the base metal and spacer layers. The amorphous layer taught by Slaughter is a seed layer of tantalum nitride on which is formed a layer of ruthenium. The amorphous seed layer promotes the subsequent amorphous formation of an FeMn pinning layer.

Dill et al. (U.S. Pat. No. 6,114,719) teaches a method of effectively biasing an MTJ device using biasing layers disposed within the device stack, so that its magnetic states are stable, yet there is not required the addition of adjacent magnetic structures which would adversely affect the high device density required for an MRAM array.

Sandhu et al. (U.S. Pat. No. 6,358,756 B1) teach a method of fabricating an MRAM structure wherein the pinned layer is recessed in a trench with the free layer positioned above it and the spacer is placed within an etched insulator positioned between them.

With the exception of Slaughter et al., none of the above cited inventions addresses the problem of device performance degradation resulting from bottom electrodes with rough surfaces. The typical sputter-deposited Cu or Al electrode is too rough to be useful, unless it is treated with various complicated smoothing processes. Although Slaughter et al. provide a smooth electrode, it requires the formation of amorphous layers that extend into the device itself. The present invention provides a simple smooth bottom electrode which can also be advantageously used for integration with CMOS devices.

SUMMARY OF THE INVENTION

It is a first object of the present invention to provide a method for forming a smooth bottom electrode for a magnetic tunneling junction (MTJ) device and to provide the device formed on such an electrode.

It is a second object of the present invention to provide such a smooth electrode with a low sheet resistance.

It is a third object of the present invention to provide an MTJ device with a smooth bottom electrode of low sheet resistance that can be easily fabricated and integrated with associated CMOS circuitry.

It is a fourth object of the present invention to provide a smooth bottom electrode of low sheet resistance that can be formed with control of its uniformity over the surface of a large semiconductor wafer (e.g. 8" diameter or greater).

It is a fifth object of the present invention to provide an MTJ device exhibiting such features associated with electrode smoothness and low sheet resistance as well controlled magnetization of the free and pinned layers, integrity of the tunnel barrier layer, junction resistance uniformity, large exchange field of the pinned layer and high thermal stability of the pinned layer.

The objects of the present invention will be achieved by use of an NiCr seed layer on which a high melting point metal such as Ru, Ir or Rh can be grown with a close packed crystal plane parallel to the plane of the deposited metal layer (e.g. (111) in FCC of Ir and Rh and (001) in HCP of Ru). In the preferred embodiment disclosed herein, Ru is the preferred metallic layer. A layer of NiCr then grown over the Ru (or other high melting point metal) layer enhances close-packed crystal plane overgrowth. The resulting electrode possesses both surface smoothness and low sheet resistance over a large formation area. The advantageous low resistance properties of such an NiCr/Ru/NiCr layer are a result of the NiCr layer performing as a specularly reflecting layer for the Ru layer. This property is also disclosed for NiCr/Ru/NiCr used in a different context in related patent application HT 00-001, assigned to the same assignee as the present application, and which is fully incorporated herein by reference. An MTJ layer, comprising, in the preferred embodiment, an MnPt pinning layer, a CoFe-Ru-CoFe pinned layer, an AlOx (aluminum oxide) tunneling layer, and a CoFe/NiFe free layer, is sequentially formed upon the bottom electrode in a simple process. There is no interdiffusion between the NiCr/Ru bilayer and the NiCr/MnPt bilayer.

DESCRIPTION OF THE PREFERRED EMBODIMENTS

Figure 1:
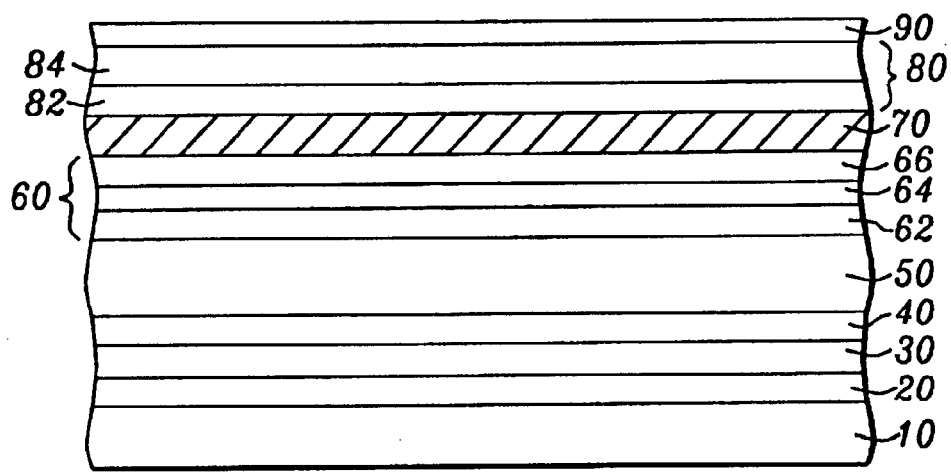
FIG. 1 is a schematic cross-sectional view of an MTJ device formed on the bottom conductor electrode of the present invention.

The present invention is an MTJ device formed on a novel smooth bottom conductor electrode of low sheet resistance, the device thereby exhibiting advantageous properties produced by such an electrode and the device being capable of efficient and economical fabrication and integration with associated CMOS circuitry on a large diameter semiconductor wafer.

The advantageous properties of the conductor electrode described herein, as well as an explanation of the origin of these properties, will be briefly discussed below, with reference to experimental data obtained by the Inventors as well as comparisons to analogous properties of prior art electrode materials that are generally known.

The fabrication of MTJ devices seeks generally to avoid structures in which there will be inhomogeneous distribution of current. Within the prior art, therefore, it has been found advantageous to form MTJ devices having AlOx barrier layers over lower electrodes which are patterned layers of low resistance, non-magnetic materials typically formed to thicknesses between 250 and 1000 angstroms. The MTJ junction resistance is typically in the $k\Omega\text{-}\mu m^2$ (kilo-ohm-micron squared) range for a thin (10–15 angstrom) AlOx barrier layer produced by the plasma oxidation of a (7–10 angstrom) Al film. To form a good, low-resistance junction requires good control of the surface roughness of the bottom electrode. Table 1 below lists the properties of low resistance (resistivity less than $10\,\mu\Omega\text{-cm}$) non-magnetic metals having the desirable properties satisfactory for use in electrodes.

TABLE 1

| Element | Xtal Structure | Atomic No. | Melting Point | Resistivity |
|---------|----------------|------------|---------------|-------------|
| Al | FCC | 13 | 660 | 2.67 |
| Cu | FCC | 29 | 1083 | 1.69 |
| Ru | HCP | 44 | 2310 | 7.7 |
| Rh | FCC | 45 | 1965 | 4.7 |
| Ag | FCC | 47 | 962 | 1.53 |
| Ir | FCC | 77 | 2410 | 5.1 |
| Au | FCC | 79 | 1064 | 2.2 |

Cu, Al, Ag and Au electrodes are disadvantageous because the as-deposited and annealed film is too rough (Table 2 below will indicate roughness measures for various metal films). Annealing tends to produce grain growth and even larger size "hillocks" in low melting point metals such as Cu, Al, Ag and Au. Consequently, the use of such metals requires significant subsequent processing to improve their smoothness. Most of the prior art experience with smoothing such electrodes relates to the fabrication of GMR read heads. Given the extreme thinness of the junction layer in an MTJ device, the required smoothing operations may require even more complex process steps. In general, however, high temperature melting-point metals tend to recrystallize with smaller grain sizes after annealing and, therefore, metals such as Ru, Rh and Ir will produce smoother electrode surfaces. With a proper seed layer, these metals can be grown with a close-packed crystal plane parallel to the plane of the deposited metal layer (which will be the (001) plane in the hexagonal close-packed (HCP) structure of Ru and the (111) plane in the face-centered cubic (FCC) structure of Rh and Ir).

An experimental study of bottom conductor electrodes was carried out by forming such electrodes of metal layers deposited on NiCr seed layers. The electrodes were formed on 3" $Al_2O_3/Si$ substrates, with the starting substrate being very smooth, as characterized by a measured Ra (peak-to-valley) value of approximately 2 angstroms. NiCr was used as the metal seed layer because it is also the seed layer for the MTJ structure formed on the electrode. All electrodes were annealed at 280° C. for 5 hours. Sheet resistance, Rs, of the as-deposited and annealed electrode was measured in ohms/squ., as was its surface roughness, Ra/RMS, both as-deposited and subsequent to annealing. The numbered electrode structures in Table 2 below correspond to the following identically numbered structures (the numbers in parentheses being thickness in angstroms):

NiCr(60)/Al(500)/NiCr(50)  1:

NiCr(60)/Al(500)  2:

NiCr(60)/Cu(500)/NiCr(50)  3:

NiCr(60)/Ru(500)/NiCr(50)  4:

NiCr(60)/Ru(1000)/NiCr(50)  5:

NiCr(60)/Ru(500)/NiCr(60)/MnPt(150)/CoFe(20)/NiCr(50)  6:

TABLE 2

| Structure | Rs, as-dep | Ra/RMS as-dep | Rs anneal | Ra/RMS anneal |
|-----------|------------|---------------|-----------|---------------|
| 1 | 0.92 | 142/17.5 | 16.4 | 18/21 |
| 2 | 0.88 | | 2.88 | |
| 3 | 0.58 | 11.4/14.1 | 0.52 | 15/18 |
| 4 | 1.73 | 4.1/5.2 | 1.69 | 4.2/5.0 |
| 5 | 0.87 | 4.3/5.5 | 0.84 | 4.1/5.2 |
| 6 | 1.67 | 3.95/4.8 | 1.60 | 3.8/4.8 |

In the case of the Cu electrode (3), the lower Rs for the annealed electrode indicates grain growth and little inter-diffusion between the NiCr and the Cu. In the case of the Al electrode (1), the increase of Rs after annealing indicates serious inter-diffusion. As expected from their relative melting points, the surface roughness of the Al electrode is greater than that of the Cu electrode. The Rs of the Ru electrode (4) is about a factor of 3 times that of the Cu electrode (3). Extrapolation from their bulk resistivities indicates that the Rs of the Ru electrode should be a factor of 4.5 (i.e. 7.7/1.69) times that of the Cu electrode. We infer that this enhancement indicates the specular reflection role of the NiCr in the case of Ru (see also related patent application HT 00-001 cited above and incorporated fully herein by reference). As can be seen in Table 2, the added partially formed MTJ layer (6) improves (or, at least, does not degrade) the smoothness of the electrode.

Referring now to FIG. 1, there is seen a schematic cross section of a preferred embodiment of the invention, wherein the MTJ layer is formed on the smooth conductor electrode as indicated in Table 2 above. There is shown first a substrate (10), which in this embodiment is a silicon substrate on which is formed a layer of $Al_2O_3$ of thickness between approximately 1000 and 10,000 angstroms. The silicon substrate can be a large diameter silicon wafer, such as an 8" diameter, or larger, silicon wafer. On the substrate is deposited a seed layer (20), which in this embodiment is a layer of NiCr formed to a thickness between approximately 50 and 100 angstroms, with approximately 50 angstroms being preferred. On the seed layer is then formed a layer of high melting point, non-magnetic metal (30), which in this embodiment is a layer of Ru, formed to a thickness between approximately 250 and 2000 angstroms, with approximately 500 angstroms being preferred. On the Ru layer there is then formed an overlayer (40), which in this embodiment is a layer of NiCr formed to a thickness between approximately 50 and 100 angstroms, with approximately 60 angstroms being preferred. On the NiCr overlayer there is then formed a pinning layer of antiferromagnetic material (50), which in this embodiment is a layer of MnPt formed to a thickness between approximately 100 and 200 angstroms, with approximately 150 angstroms being preferred. On the pinning layer there is then formed a ferromagnetic pinned layer (60), which in this embodiment is a laminated synthetic structure providing a strong pinning field, comprising first (62) and second (66) layers of CoFe, between which is formed a layer of Ru (64). The first CoFe layer is between approximately 20 and 30 angstroms in thickness with approximately 25 angstroms being preferred, the second CoFe layer is between approximately 25 and 35 angstroms in thickness with approximately 30 angstroms being preferred and the Ru layer is between approximately 7 and 9 angstroms, with approximately 7.5 angstroms being preferred.

On the pinned layer there is then formed a tunneling barrier layer (70), the barrier layer being a dielectric layer which in this embodiment is a layer of oxidized aluminum (AlOx) of thickness between approximately 10 and 15 angstroms with approximately 12 angstroms being preferred. The oxidized Al layer is formed by oxidizing an Al layer which is initially approximately 8 angstroms thick. On the barrier layer there is then formed a ferromagnetic free layer (80), which in this embodiment is a laminated layer comprising a layer of CoFe (82) of thickness between approximately 10 and 20 angstroms with approximately 15 angstroms being preferred, on which is formed a layer of NiFe (84) of thickness between approximately 20 and 40 angstroms with approximately 30 angstroms being preferred. On the free layer is then formed an upper capping layer (90), which in this embodiment can be either a layer of Ru or a layer of Ta formed to a thickness between approximately 200 and 300 angstroms, with approximately 250 angstroms being preferred. The layers above the AlOx layer, taken together, form the top electrode of the MTJ device.

It is now further disclosed that the MTJ device shown in FIG. 1 may be replicated to form an array of such devices, said array having as its common bottom electrode the smooth electrode of the present invention. It is also noted, that the array of such MTJ devices may be vertically integrated with associated CMOS logic circuitry in fabricating an MTJ MRAM array. A distinct advantage of the smooth electrode of the present invention is that it may be formed on a substrate of large surface area which can then accommodate additional integrated circuitry.

Figure 2:
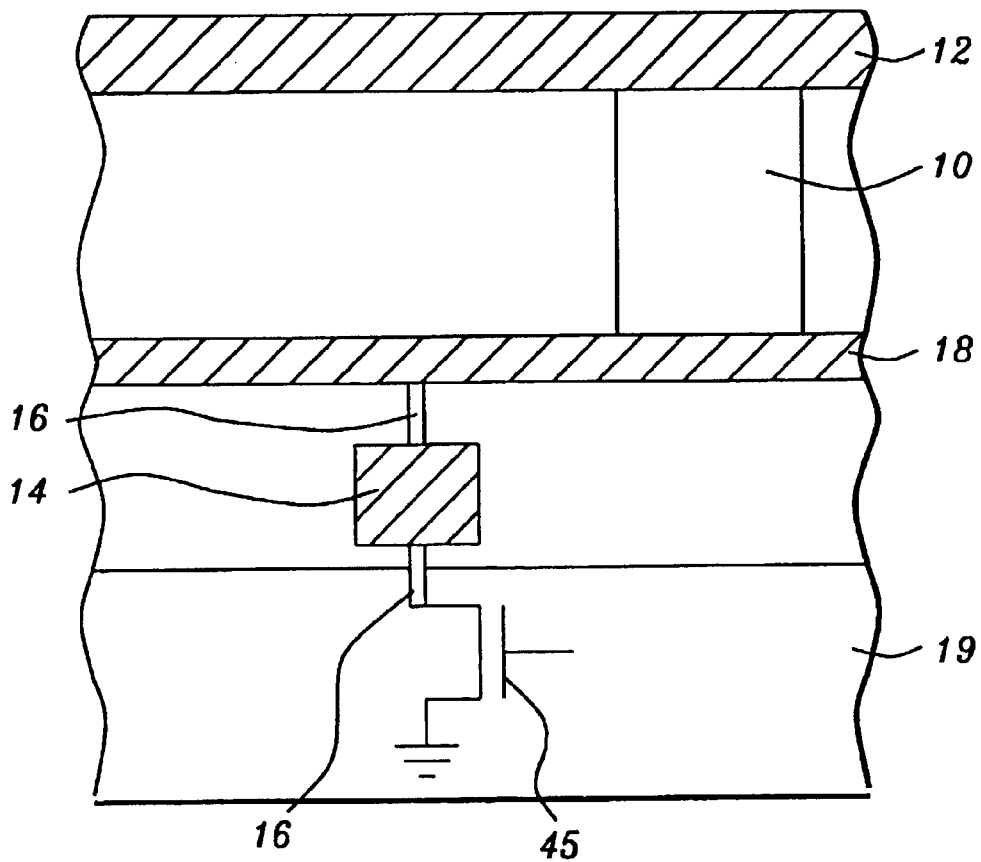
FIG. 2 is a schematic overhead view of an MTJ device and an associated CMOS circuit element formed vertically below said device and electrically connected to the common bottom conductor electrode of the present invention.

Referring now to FIG. 2, there is shown a schematic diagram, in an cross-sectional view, of a single MTJ device (10) (details not shown) which is part of an array of such devices, individually formed on the bottom conductor electrode of the present invention in accord with the description given above and integrated with associated CMOS logic circuitry, which is formed vertically below said device array. As is shown schematically in the diagram, each device in the array is accessed above by a conducting bit line (12) in the plane of the diagram and below by a conducting digit line (14) which runs transverse to the plane of the drawing. A conducting lead (16), formed of the same material as the bottom conductor (18), passes through via holes in an insulating layer (19) to contact a CMOS transistor (45) of the CMOS array, only a single such transistor being shown symbolically in this figure. The single transistor is part of an array of such transistors that allow access to the data stored in the MTJ device. It is to be noted that electrodes of the prior art could not be formed with the required smoothness and uniform low sheet resistance to allow such large scale integration upon a single common electrode.

As is understood by a person skilled in the art, the preferred embodiments of the present invention are illustrative of the present invention rather than limiting of the present invention. Revisions and modifications may be made to methods, materials, structures and dimensions employed in forming and providing an MTJ device and an array of such devices having a smooth bottom electrode of low sheet resistance, while still forming and providing such a device and array in accord with the spirit and scope of the present invention as defined by the appended claims.

What is claimed is:

1. A magnetic tunneling junction (MTJ) device having a smooth bottom conductor electrode of low sheet resistance comprising:

a substrate having a substantially planar upper surface;

a bottom conductor electrode layer formed on said substrate, said bottom conductor electrode layer formed of substantially planar layers and further comprising:

a crystalline growth enhancing seed layer formed on said substrate;

a non-magnetic high melting point metal layer formed on said seed layer, said metal having its crystal plane aligned by said seed layer parallel to the plane of said metal layer;

an overlayer formed on said metal layer, said overlayer providing crystal alignment for subsequently formed layers and said seed layer and said overlayer providing enhanced specular reflection of electrons within said metal layer, thereby reducing the sheet resistance of said bottom electrode layer;

a substantially planar MTJ layer formed on said bottom conductor lectrode layer;

a capping layer formed on said MTJ layer.

2. The device of claim 1 wherein said seed layer is a layer of NiCr formed to a thickness between approximately 50 and 100 angstroms.

3. The device of claim 1 wherein said non-magnetic high melting point metal layer is a layer of Ru, Rh or Ir.

4. The device of claim 3 wherein the metal layer is a layer of Ru formed to a thickness between approximately 250 and 1000 angstroms.

5. The device of claim 4 wherein the (001) plane of the hexagonal close packed (HCP) crystalline structure of the Ru layer is parallel to the plane of the Ru layer.

6. The device of claim 1 wherein the MTJ layer comprises:

a pinning layer formed of antiferromagnetic material;

a pinned layer formed on said pinning layer and pinned thereto by exchange coupling;

a dielectric tunneling barrier layer formed on said pinned layer;

a ferromagnetic free layer formed on said tunneling barrier layer.

7. The device of claim 6 wherein the antiferromagnetic pinning layer is a layer of MnPt formed to a thickness of between approximately 100 and 200 angstroms.

8. The device of claim 6 wherein the pinned layer is a laminate comprising;

a first layer of CoFe;

a layer of Ru formed on said first layer of CoFe;

a second layer of CoFe formed on said layer of Ru.

9. The device of claim 8 wherein the first layer of CoFe is formed to a thickness between approximately 20 and 30 angstroms and the second layer of CoFe is formed to a thickness between approximately 25 and 35 angstroms.

10. The device of claim 8 wherein the Ru layer is formed to a thickness between approximately 7 and 9 angstroms.

11. The device of claim 6 wherein the tunneling barrier layer is a layer of oxidized aluminum (AlOx) formed to a thickness between approximately 10 and 15 angstroms.

12. The device of claim 6 wherein the ferromagnetic free layer is a double layer comprising a layer of CoFe formed to a thickness between approximately 10 and 20 angstroms on which is formed a layer of NiFe of a thickness between approximately 20 and 40 angstroms.

13. The device of claim 1 wherein the upper capping layer is a layer of Ru formed to a thickness of between approximately 200 and 300 angstroms.

14. The device of claim 1 wherein the substrate is a semiconductor wafer of large surface area and it is uniformly covered by the bottom electrode.

15. The device of claim 14 wherein the semiconductor wafer is a silicon wafer of diameter greater than 8 inches.

16. An array of MTJ devices formed as an MRAM array and integrated with associated CMOS circuitry, said array and said circuitry formed on a single smooth bottom conductor electrode of low sheet resistance comprising:

a substrate having a substantially planar upper surface;

a bottom conductor electrode layer formed on said substrate, said bottom conductor electrode formed of substantially planar layers and further comprising:

a crystalline growth enhancing seed layer;

a non-magnetic high melting point metal layer formed on said seed layer, said metal having its crystal plane aligned by said seed layer parallel to the plane of said metal layer;

an overlayer formed on said metal layer, said overlayer providing crystal alignment for subsequently formed layers and said seed layer and said overlayer providing enhanced specular reflection of electrons within said metal layer, thereby reducing the sheet resistance of said bottom electrode layer;

an array of substantially planar MTJ layers formed on said bottom electrode layer;

CMOS logic circuitry formed vertically below said bottom electrode layer and integrated with said array of MTJ layers by means of conducting interconnections to said bottom conductor electrode to form, thereby, an MRAM array.

17. The array of claim 16 wherein said seed layer is a layer of NiCr formed to a thickness between approximately 50 and 100 angstroms.

18. The array of claim 16 wherein said non-magnetic high melting point metal layer is a layer of Ru, Rh or Ir.

19. The array of claim 16 wherein the metal layer is a layer of Ru formed to a thickness between approximately 250 and 1000 angstroms.

20. The array of claim 16 wherein the (001) plane of the hexagonal close packed (HCP) crystalline structure of the Ru layer is parallel to the plane of the Ru layer.

21. A method of forming an MTJ device having a smooth bottom conductor electrode of low sheet resistance comprising:

providing a substrate having a substantially planar upper surface;

forming a bottom conductor electrode on said substrate, said bottom electrode formed of substantially planar layers and further comprising:

forming a crystalline growth enhancing seed layer on said substrate;

forming a non-magnetic high melting point metal layer on said seed layer, said metal having its crystal plane aligned by said seed layer parallel to the plane of said metal layer;

forming an overlayer on said metal layer, said overlayer providing crystal alignment for subsequently formed layers and said seed layer and said overlayer providing enhanced specular reflection of electrons within said metal layer, thereby reducing the sheet resistance of said bottom electrode layer;

forming a substantially planar MTJ layer on said bottom electrode layer;

forming a capping layer on said MTJ layer.

22. The method of claim 21 wherein said seed layer is a layer of NiCr formed to a thickness between approximately 50 and 100 angstroms.

23. The method of claim 21 wherein said non-magnetic high melting point metal layer is a layer of Ru, Rh or Ir.

24. The method of claim 21 wherein the metal layer is a layer of Ru formed to a thickness between approximately 250 and 1000 angstroms.

25. The method of claim 21 wherein the (001) plane of the hexagonal close packed (HCP) crystalline structure of the Ru layer is parallel to the plane of the Ru layer.

* * * * *